US012673817B2

(12) United States Patent
Kobayashi

(10) Patent No.: US 12,673,817 B2
(45) Date of Patent: Jul. 7, 2026

(54) OVERHEAD CONVEYING VEHICLE

(71) Applicant: MURATA MACHINERY, LTD.,
Kyoto (JP)

(72) Inventor: Makoto Kobayashi, Ise (JP)

(73) Assignee: MURATA MACHINERY, LTD.,
Kyoto (JP)

( * ) Notice: Subject to any disclaimer, the term of this
patent is extended or adjusted under 35
U.S.C. 154(b) by 405 days.

(21) Appl. No.: 18/291,054

(22) PCT Filed: Mar. 30, 2022

(86) PCT No.: PCT/JP2022/016085
§ 371 (c)(1),
(2) Date: Jan. 22, 2024

(87) PCT Pub. No.: WO2023/013172
PCT Pub. Date: Feb. 9, 2023

(65) Prior Publication Data
US 2024/0351782 A1 Oct. 24, 2024

(30) Foreign Application Priority Data

Aug. 2, 2021 (JP) ................................. 2021-126800

(51) Int. Cl.
*B65G 1/04* (2006.01)
*B65G 1/06* (2006.01)
*B65G 47/60* (2006.01)
*B65G 47/61* (2006.01)
*B65G 49/07* (2006.01)
(Continued)

(52) U.S. Cl.
CPC ............. *B65G 1/0457* (2013.01); *B65G 1/04*
(2013.01); *B65G 1/065* (2013.01); *B65G*
*47/60* (2013.01); *B65G 47/61* (2013.01);

*B65G 49/07* (2013.01); *B66C 13/04* (2013.01);
*B66C 13/06* (2013.01); *B66C 13/066*
(2013.01); *H10P 72/30* (2026.01); *H10P*
*72/3214* (2026.01); *H10P 72/3221* (2026.01);
*B61B 13/06* (2013.01)

(58) Field of Classification Search
CPC ........ B65G 1/0457; B65G 1/065; B65G 1/04;
B65G 49/07; B65G 47/60; B65G 47/61;
B66C 13/06; B66C 13/04; B66C 13/066;
H10P 72/30; H10P 72/3214; H10P
72/3221; B61B 13/06
USPC .......................................... 104/89
See application file for complete search history.

(56) References Cited

U.S. PATENT DOCUMENTS

2020/0243363 A1* 7/2020 Yuasa ................. H10P 72/3206

FOREIGN PATENT DOCUMENTS

| CN | 213292298 U | * | 5/2021 | |
| JP | 2001-298065 A | | 10/2001 | |
| WO | WO-2021049203 A1 | * | 3/2021 | .......... H10P 72/3221 |

* cited by examiner

*Primary Examiner* — S. Joseph Morano
*Assistant Examiner* — James William Jones
(74) *Attorney, Agent, or Firm* — Keating & Bennett, LLP

(57) ABSTRACT

In an overhead conveying vehicle, a main body to hold a
conveyed object is suspended and supported by a conveyor.
The overhead conveying vehicle includes: a base unit sus-
pended from the conveyor, a support part in the main body
to rotatably support the base unit via a turning shaft extend-
ing in a horizontal direction, and a pair of dampers sand-
wiching the turning shaft in a second direction perpendicular
or substantially perpendicular to both the first direction in
which the turning shaft extends and the vertical direction,
and movable to contact with the main body.

16 Claims, 7 Drawing Sheets

(51) Int. Cl.
| | |
|---|---|
| B66C 13/04 | (2006.01) |
| B66C 13/06 | (2006.01) |
| H10P 72/30 | (2026.01) |
| B61B 13/06 | (2006.01) |

OVERHEAD CONVEYING VEHICLE

BACKGROUND OF THE INVENTION

1. Field of the Invention

The present invention relates to overhead conveying vehicles.

2. Description of the Related Art

Japanese Unexamined Patent Publication No. 2001-298065 discloses an automated guided vehicle (AGV) including a cart, an AGV body attached to the cart via a damper for vibration isolation, and a transfer device attached to the AGV body. The AGV of Japanese Unexamined Patent Publication No. 2001-298065 can reduce vibrations transmitted to an article while traveling.

SUMMARY OF THE INVENTION

However, although the above conventional AGV can reduce the vibration transmitted to an article (conveyed object) during traveling, there is a risk that swaying occurs in the article. In particular, in overhead conveying vehicles with a configuration in which a main body part holding a conveyed object is suspended and supported by a traveling part, the conveyed object sways more largely.

Therefore, example embodiments of the present invention provide overhead conveying vehicles each capable of reducing or preventing vibrations from a conveyor from being propagated to a conveyed object and also reducing or preventing swaying in the conveyed object.

An overhead conveying vehicle according to an example embodiment of the present invention includes a main body to hold a conveyed object suspended and supported by a conveyor, a base suspended by the conveyor, a support provided on the main body to rotatably support the base via a turning shaft extending in a horizontal direction, and a pair of dampers provided on the base to sandwich the turning shaft in a second direction perpendicular or substantially perpendicular to both of a first direction in which the turning shaft extends and a vertical direction and movable to contact with the main body.

In the overhead conveying vehicle with this configuration, vibrations propagated from the conveyor are absorbed by the base, which is rotatably supported with respect to the main body, and a relative positional relationship between the main body and the conveyor (e.g., a posture of the main body with respect to the conveyor) is stably maintained by the dampers. As a result, it is possible to reduce or prevent vibrations from the conveyor from being propagated to the conveyed object, and also reduce or prevent swaying in the conveyed object.

In an overhead conveying vehicle according to an example embodiment of the present invention, the turning shaft may be extend in a direction perpendicular or substantially perpendicular to both a traveling direction of the conveyor and the vertical direction, and may be located in a central or approximately central region of the main body in the traveling direction of the conveyor, and the pair of dampers may be sandwich the turning shaft in the traveling direction of the conveyor. In this configuration, when an angular change of the conveyor is allowed with respect to the main body, the angular change of the conveyor is allowed only in the traveling direction of the conveyor, so that tilting of the main body portion can be reduced or minimized when the conveyed object is transferred in a right-and-left direction (lateral direction) perpendicular or substantially perpendicular to the traveling direction.

In an overhead conveying vehicle according to an example embodiment of the invention, the base may be suspended from the conveyor via a pair of suspensions extending downward in the vertical direction from the conveyor, and the base may rotatably support the suspensions around an axis of the turning shaft that extends in an extending direction of the suspensions. With this configuration, in the suspensions, it is possible to reduce torsional stress between an attachment portion to the conveyor and an attachment portion to the base.

A conveyor of an overhead conveying vehicle according to an example embodiment of the present invention may include a traveling driver to be accelerated or braked by a magnetic force generated between the conveyor and a magnetic plate on a traveling rail. In an overhead conveying vehicle including such a traveling driver, an electromagnet linear DC motor (LDM), which is included in the traveling driver, and the magnetic plate, are positioned with a small gap interposed therebetween, so that there is a risk of collision between the traveling driver and the magnetic plate when the conveyor is pushed upward by a change in the posture of the main body. In the overhead conveying vehicle with this configuration, the damper in direct contact with the main body and the suspension connected to the conveyor do not overlap with each other in plan view, and thus it is possible to reduce or prevent a change in the posture of the main body from directly pushing up the conveyor. As a result, the risk of collision between the traveling driver and the magnetic plate can be reduced.

In an overhead conveying vehicle according to an example embodiment of the present invention, the damper may include a rubber and a spring. In this configuration, pressurization generated in the damper can be easily adjusted by compressing the rubber, so that the relative positional relationship between the main body and the conveyor can be maintained more stably.

In an overhead conveying vehicle according to an example embodiment of the present invention, the support may rotatably support the turning shaft via a rubber bush. With this configuration, it is possible to effectively reduce or prevent vibrations from the conveyor, including not only vibrations in the turning direction of the turning shaft but also vibrations in other directions, from being propagated to the conveyed object.

With example embodiments of the present invention, it is possible to reduce or prevent vibrations from the conveyor from being propagated to the conveyed object, and also to reduce or prevent swaying in the conveyed object.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

An overhead conveying vehicle 1 according to an example embodiment will now be described with reference to the drawings. In the description of the drawings, like elements are designated by like reference signs, and duplicate description is omitted.

Figure 1:
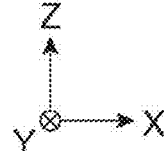
FIG. 1 is a side view of an overhead conveying vehicle according to an example embodiment of the present invention when viewed from side.

The overhead conveying vehicle 1 illustrated in FIG. 1 travels along a traveling rail R installed at a position higher than a floor, such as on a ceiling of a clean room. The overhead conveying vehicle 1 transports a conveyed object 90 between a storage facility and a predetermined load port, for example. Examples of the conveyed object 90 include containers such as a front opening unified pod (FOUP) that store a plurality of semiconductor wafers and reticle pods that store glass substrates, and general components, and the like. The containers described above have a flange 98 to be held by the overhead conveying vehicle 1.

In the following description, for convenience of explanation, the right-and-left direction (X-axis direction) in FIG. 1 is defined as "front-and-rear direction" (second direction) of the overhead conveying vehicle 1. The up-and-down direction (Z-axis direction) in FIG. 1 is defined as an up-and-down direction (vertical direction) of the overhead conveying vehicle 1. A depth direction (Y-axis direction) in FIG. 1 is defined as a right-and-left direction or a width direction (first direction) of the overhead conveying vehicle 1. The X-axis, the Y-axis, and the Z-axis are perpendicular or substantially perpendicular to each other.

Figure 2:
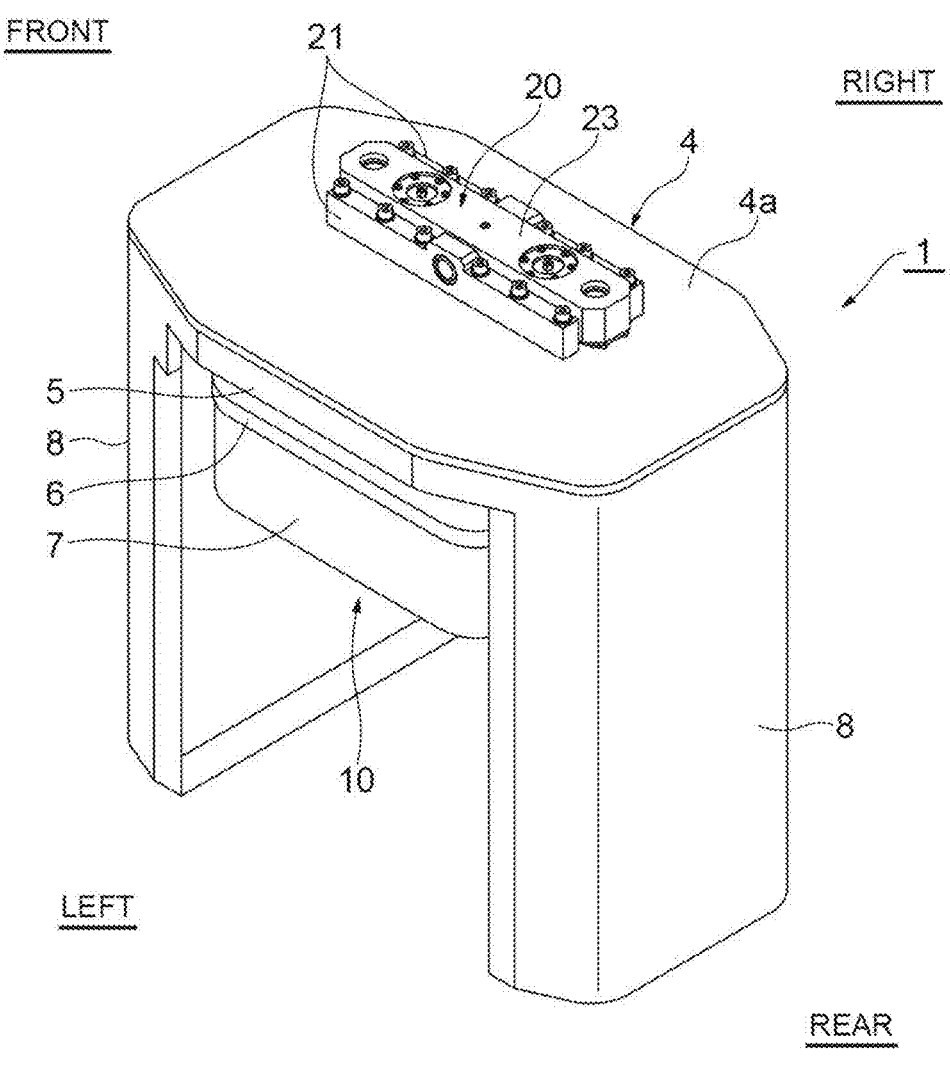
FIG. 2 is a perspective view of a main body frame of the overhead conveying vehicle of FIG. 1 when viewed from obliquely above.

As illustrated in FIGS. 1 and 2, the overhead conveying vehicle 1 includes a conveyor 2, a main body 3, and a lift 10. The conveyor 2 moves the overhead conveying vehicle 1 along the traveling rail R. The conveyor 2 is disposed inside the traveling rail R.

The conveyor 2 includes a front traveling body 2A and a rear traveling body 2B. A connection portion 2D provided on the front traveling body 2A and a connection portion 2D provided on the rear traveling body 2B are rotatably connected by a connection shaft 2E. The front traveling body 2A and the rear traveling body 2B are provided with respective traveling rollers 2C, 2C and respective traveling drivers 2M, 2M. The traveling driver 2M of the present example embodiment includes an LDM (Linear DC Motor) that accelerates or brakes the overhead conveying vehicle 1 by magnetic force generated between the LDM and a magnetic plate P disposed on a top surface of the traveling rail R.

The main body 3 is suspended and supported by the conveyor 2. More precisely, the main body 3 is suspended and supported by the conveyor 2 when a pair of suspensions 2F, 2F extending downward in the vertical direction from the conveyor 2 are connected to a vibration isolation unit 20 provided in a main frame 4 of the main body 3. Note that details of the vibration isolation unit 20 are described in detail in a later section. The main body 3 has a main frame 4, a horizontal driver 5, a rotary driver 6, a lifting driver 7, a lift 10, a pair of covers 8, 8, and a controller 80.

The horizontal driver 5 is fixed to a lower portion of the main frame 4. The horizontal driver 5 moves the rotary driver 6, the lifting driver 7, and the lift 10 in a direction perpendicular or substantially perpendicular to the extending direction of the traveling rail R (right-and-left direction) in a horizontal plane. The rotary driver 6 rotates the lifting driver 7 and the lift 10 in the horizontal plane. The lifting driver 7 raises and lowers the lift 10 by winding and paying out four belts 9. Note that as the belts 9 in the lifting driver 7, appropriate suspensions such as wires or ropes may be used.

The lift 10 is provided to be able to be raised and lowered by the lifting driver 7, and functions as a lifting platform in the overhead conveying vehicle 1. The lift 10 includes a holding device 11 configured to grip the conveyed object 90, and is raised and lowered by the belts 9 with respect to the horizontal driver 5, the rotary driver 6, and the lifting driver 7 included in the main body. The holding device 11 holds the conveyed object 90. The holding device 11 includes a pair of arms 12, 12 formed in a L shape, hooks 13, 13 fixed to the respective arms 12, 12, and an opening/closing mechanism 15 configured to open and close the pair of arms 12, 12.

The opening/closing mechanism 15 moves the pair of arms 12, 12 in a direction coming closer to each other and in a direction separating apart from each other. The pair of arms 12, 12 are moved forward and backward in the front-and-rear direction in accordance with an operation of the opening/closing mechanism 15. By this movement, the pair of hooks 13, 13 fixed to the arms 12, 12 are opened and closed.

In the present example embodiment, a height position of the holding device 11 (the lift 10) is adjusted (lowered) so that the holding surface of each hook 13 is positioned lower than the height of the lower surface of the flange 98 when the pair of hooks 13, 13 are in an open state. In this state, when the pair of hooks 13, 13 are brought into a closed state, the holding surfaces of the hooks 13, 13 are moved forward below the lower surface of the flange 98, and the lift 10 is raised in this state, so that the flange 98 is held (gripped) by the pair of hooks 13, 13, and the conveyed object 90 is supported.

The pair of covers 8, 8 are provided on the front and the rear of the traveling direction to cover the horizontal driver 5, the rotary driver 6, the lifting driver 7, the lift 10, and the holding device 11. The pair of covers 8, 8 define a space to accommodate the conveyed object 90 below the holding device 11 in a state in which the lift 10 has ascended to its ascending end. Each of the paired covers 8, 8 includes a drop prevention mechanism 8A and a swaying suppression mechanism 8B. The drop prevention mechanism 8A prevents the conveyed object 90 held by the holding device 11 from falling in the state in which the lift 10 has ascended to its ascending end. The swaying suppression mechanism 8B reduces or prevents swaying of the conveyed object 90 held by the holding device 11 in the front-and-rear direction (traveling direction) and the right-and-left direction of the overhead conveying vehicle 1 during traveling.

The controller 80 is an electronic control unit including a central processing unit (CPU), a read only memory (ROM), a random access memory (RAM), and the like. The controller 80 is configured or programmed to control various operations of the overhead conveying vehicle 1. Specifically, the controller 80 is configured or programmed to control the conveyor 2, the horizontal driver 5, the rotary driver 6, and the lifting driver 7. The controller 80 can include software, for example, in which a program stored in the ROM is loaded onto the RAM and executed by the CPU. The controller 80 may include hardware including electronic circuitry or the like. The controller 80 may be configured or programmed to communicate with a higher-level controller (not illustrated) using a power feeder (power feeding line) or a feeder line on the traveling rail R.

Figure 3:
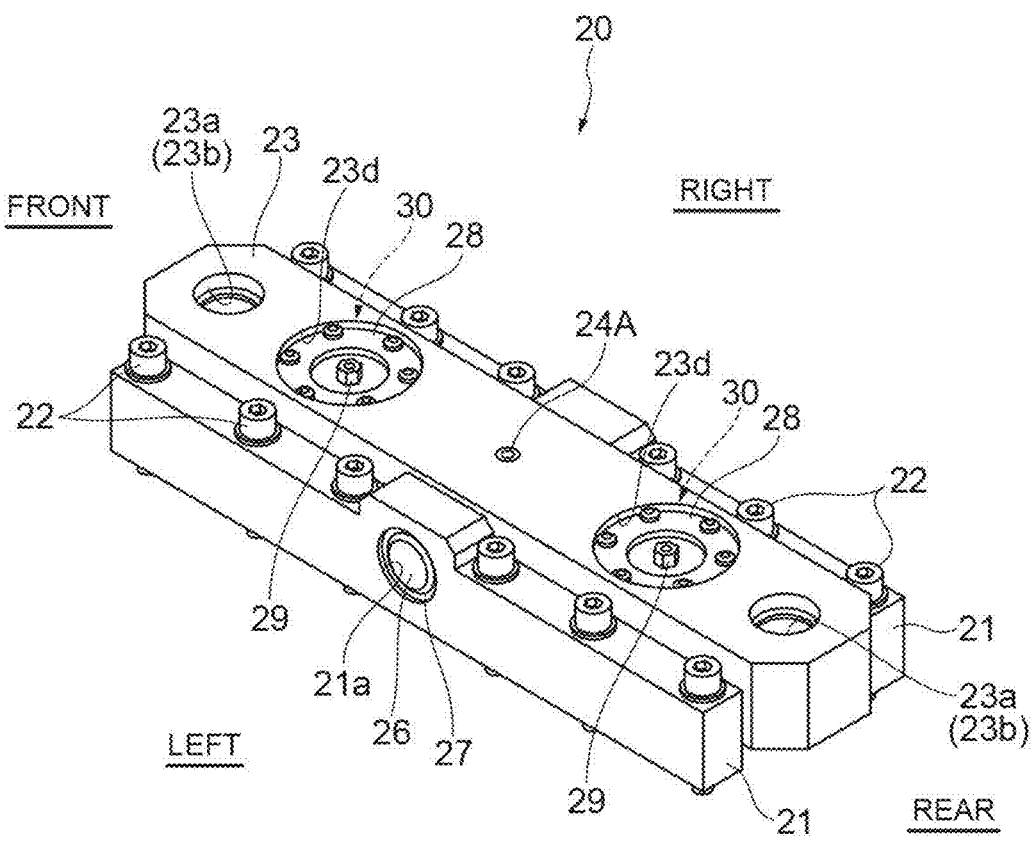
FIG. 3 is a perspective view of a vibration isolation unit when viewed from obliquely above.
Figure 4:
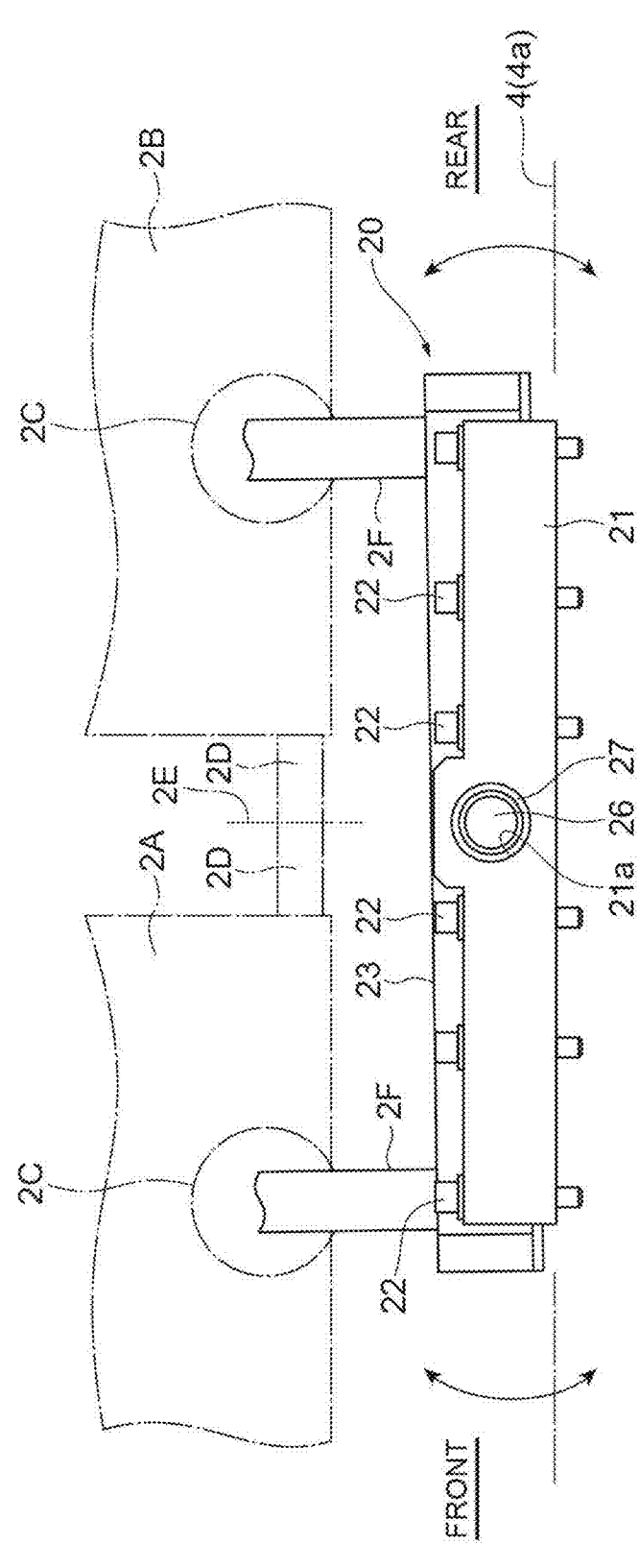
FIG. 4 is a side view of the vibration isolation unit when viewed from side.
Figure 5:
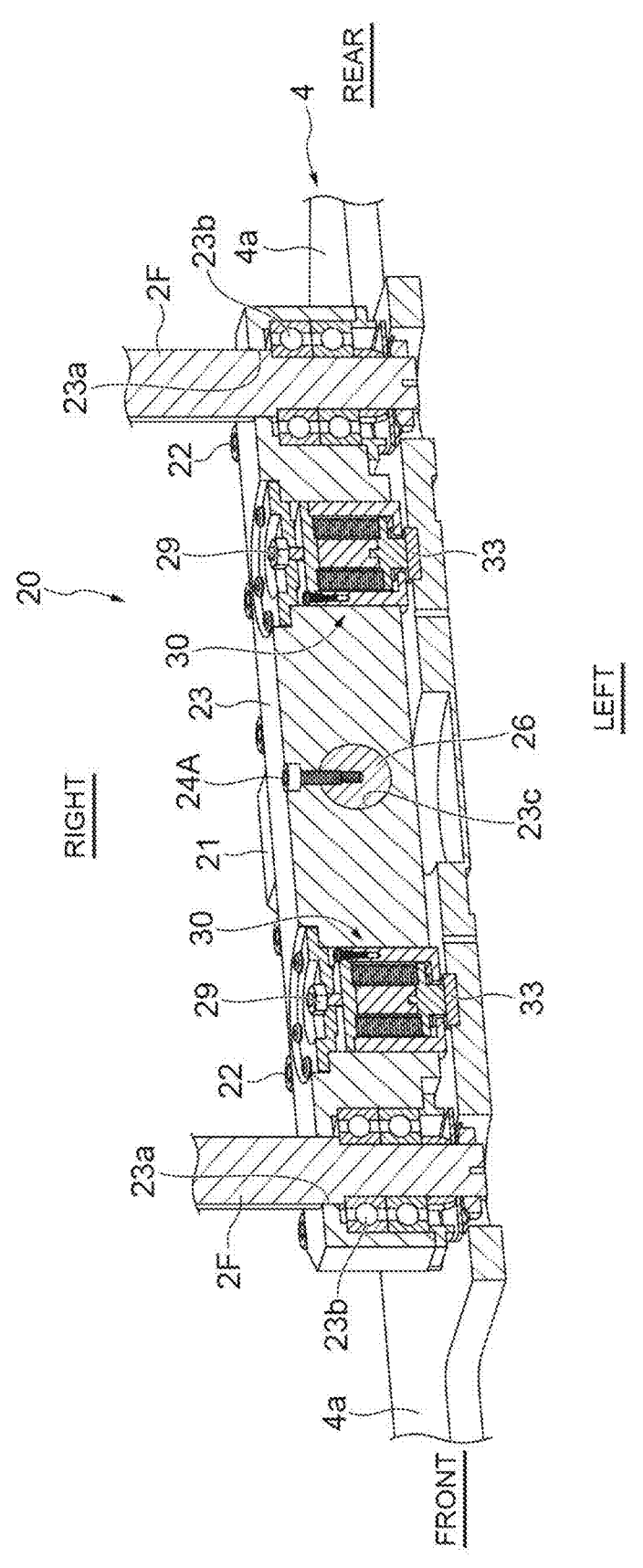
FIG. 5 is a sectional view of the vibration isolation unit cut along a front-and-rear direction.

The following describes the vibration isolation unit 20. As illustrated in FIG. 3 to FIG. 5, the vibration isolation unit 20 includes a pair of supports 21, 21, a base 23, and a pair of dampers 30, 30.

The pair of supports 21, 21 are spaced apart in the right-and-left direction and are fixed to a top surface 4a of the main frame 4. The pair of supports 21, 21 are fixed to the main frame 4 by members such as screws 22, for example. A turning shaft 26 extending horizontally in the right- and left direction is crossed over the pair of supports 21, 21. More precisely, each of the paired supports 21, 21 includes an insertion hole 21a through which the turning shaft 26 is inserted. A resin bush 27 of a cylindrical shape is interpolated in the insertion hole 21a, and the turning shaft 26 is interposed in the resin bush 27. In other words, the turning shaft 26 is supported by the pair of supports 21, 21 with the resin bushes 27. The turning shaft 26 is disposed in substantially the center of the main frame 4 in the front-and-rear direction, but the turning shaft 26 may be shifted to either the front or rear depending on a position of the center of gravity of the main frame 4 or other factors.

The base 23 is suspended from the conveyor 2 via the pair of suspensions 2F, 2F. The base 23 extends in the front-and-rear direction. The base 23 includes insertion holes 23a, 23a through which the pair of suspensions 2F, 2F can be inserted, respectively. The insertion holes 23a, 23a are preferably provided at both ends of the base 23 in the front-and-rear direction. Moreover, an inner circumferential surface of the insertion hole 23a is provided with a bearing 23b that rotatably supports the suspension 2F around an axis along the extending direction of the suspension 2F.

The base 23 is not rotatable with respect to the turning shaft 26. More precisely, the turning shaft 26 is inserted into an insertion hole 23c formed in the base 23, and the turning shaft 26 and the base 23 are fixed by a screw 24A. The base 23 is supported by the pair of supports 21, 21 in a rotatable state via the turning shaft 26 extending in the horizontal direction. In other words, the pair of supports 21, 21 rotatably support the turning shaft 26 that rotates integrally with the base 23.

The pair of dampers 30, 30 are provided to sandwich the turning shaft 26 in the front-and-rear direction and to come into contact with the top surface 4a of the main frame 4. The damper 30 is interposed in an insertion hole 23d formed in the base 23, and is positioned such that a portion of the damper 30 protrudes downward (to the top surface 4a of the main frame 4). The damper 30 absorbs energy generated when coming into contact with the top surface 4a of the main frame 4.

Figure 6:
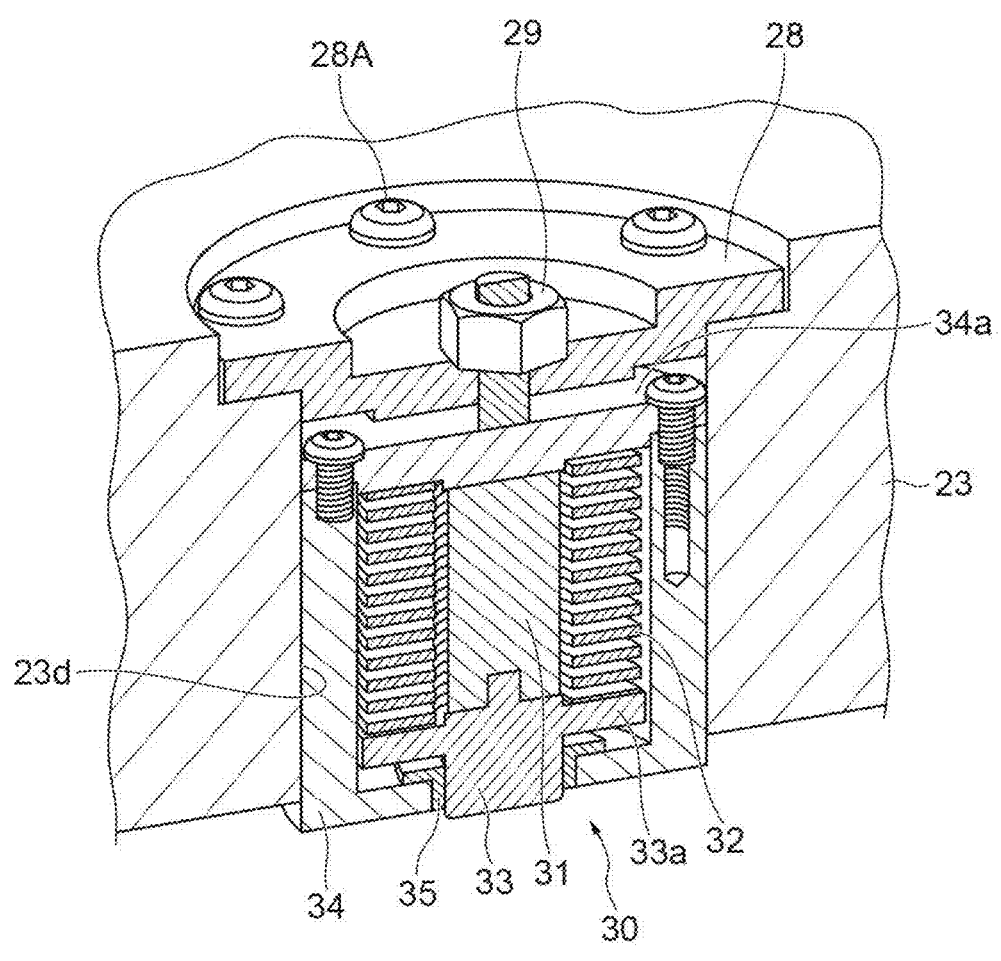
FIG. 6 is a sectional perspective view illustrating an inner structure of a damper.

As illustrated in FIGS. 5 and 6, the damper 30 includes a rubber 31, a spring 32, a contact 33, a housing 34, and a buffer 35. The rubber 31 has elasticity, and is formed of, for example, urethane rubber or other materials. The spring 32 is disposed to have the rubber 31 interposed therein. The elasticity of the spring 32 may be greater than that of the rubber 31. This allows the elasticity of the rubber 31 to be added to the contact 33 when the spring 32 shrinks to some degree. The contact 33 is movable to contact with the top surface 4a of the main frame 4. A portion of the lower portion of the contact 33, the portion coming into contact with the top surface 4a of the main frame 4, is formed of a material having compression-resistance such as ultra-high molecular weight polyethylene. The upper portion of the contact 33 includes a flange 33a formed therein that comes into contact with a lower end of the rubber 31 and a lower end of the spring 32. The spring 32 of the present example embodiment comes into contact with the contact 33 in a state of being compressed, that is, pressurization is applied thereto. The housing 34 accommodates the rubber 31, the spring 32, and a portion of the contact 33. The buffer 35 is a resin bush provided to prevent wear due to vertical movement of the contact 33.

The base 23 is provided with a lid 28 that covers an upper opening of the insertion hole 23d. The lid 28 is fixed to the base 23 by a screw 28A or other structures or methods. The center of the lid 28 is provided with an adjustment screw 29 to adjust an amount of push by the damper 30 onto the main frame 4 (the amount of protrusion of the contact 33 from the base 23). A tip of the adjustment screw 29 is in contact with a top surface 34a of the housing 34. The amount of protrusion of the contact 33 protruding from the lower surface of the base 23 can be adjusted by rotating the adjustment screw 29 with respect to the lid 28.

The following describes a working effect of the overhead conveying vehicle 1 according to the present example embodiment described above. As illustrated in FIG. 4, in the overhead conveying vehicle 1 of the above example embodiment, vibrations propagated from the conveyor 2 are absorbed by the base 23, the base being rotatably supported by the main body 3 (the main frame 4). Furthermore, in the overhead conveying vehicle 1 of the above example embodiment, even if the conveyor 2 tilts due to the conveyor 2 climbing over a step or the like during traveling, the main body 3, the weight value of which is relatively larger than the conveyor 2, tends to maintain its posture by inertial force. In the overhead conveying vehicle 1 of the above example embodiment, the relative positional relationship between the main body 3 and the conveyor 2 is stably maintained by the damper 30. As a result, it is possible to reduce or prevent vibrations from the conveyor 2 from being propagated to the conveyed object 90, and also reduce or prevent swaying in the conveyed object 90.

In the overhead conveying vehicle 1 of the above example embodiment, as illustrated in FIG. 5, the turning shaft 26 extends in the right-and-left direction and is also located in a central or approximately central region of the main body 3 in the traveling direction of the conveyor 2, and the pair of dampers 30, 30 are provided to sandwich the turning shaft 26 in the traveling direction of the conveyor 2. This allows angle change only in the traveling direction of the conveyor 2 when the angular change of the conveyor 2 is allowed with respect to the main body 3, so that the tilting of the main body 3 can be reduced or minimized when the conveyed object 90 is transferred in a right-and-left direction (lateral direction).

In the overhead conveying vehicle 1 of the above example embodiment, the suspensions 2F, 2F are rotatably supported via the bearing 23b with respect to the base 23 around an axis of the turning shaft that extends in an extending direction of the suspensions 2F, 2F. This makes it possible to reduce or prevent torsional stress between the attachment portion with respect to the conveyor 2 and the attachment portion with respect to the base 23 in the suspensions 2F, 2F.

In the overhead conveying vehicle 1 of the above example embodiment, the pair of dampers 30, 30 that directly contact the main body 3 and the pair of suspensions 2F, 2F that are connected to the conveyor 2 do not overlap with each other in plan view, and thus it is possible to reduce or prevent a change in the posture of the main body 3 from directly pushing up the conveyor 2. This reduces a risk of collision between the LDM included in the traveling driver 2M and the magnetic plate P.

Figure 7A:
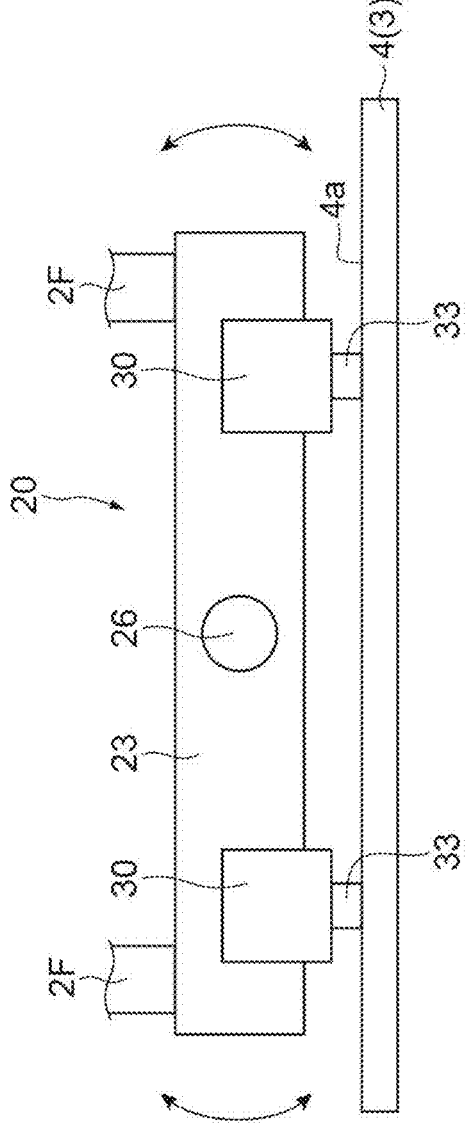
FIGS. 7A and 7B each are views explaining an operation of the damper applied with pressurization.

In the overhead conveying vehicle 1 of the above example embodiment, since the damper 30 includes the rubber 31 and a spring 32, as illustrated in FIG. 6, pressurization generated in the damper 30 can be easily adjusted by compressing the spring 32. In the damper 30 of the present example embodiment, a predetermined pressurization is applied. In the overhead conveying vehicle 1 of the present example embodiment, as illustrated in FIG. 7A, when both the conveyor 2 and the main body 3 have no tilt, the contact 33 of the damper 30 and the top surface 4a of the main frame 4 are in contact with each other in a state in which the contact 33 does not exert any force on the main frame 4. Note that the contact 33 can be brought into contact with the top surface 4a of the main frame 4 by rotating the adjustment screw 29 to adjust the amount of protrusion of the contact 33.

Figure 7B:
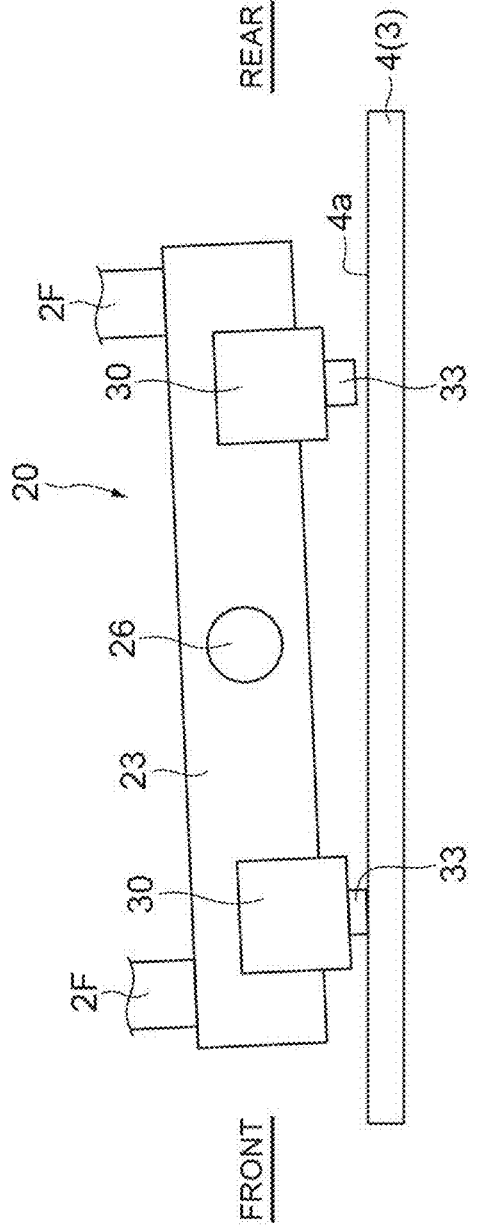

Here, when the conveyor 2 accelerates forward, as illustrated in FIG. 7B, the base 23 in a freely rotatable state is subjected to force in a manner to sink frontward. However, in the damper 30 to which pressurization is applied, even if such force that causes the base 23 to sink frontward is applied, the spring 32 and the rubber 31 are not compressed until force exceeding a predetermined value (i.e., force exceeding the force applied to the spring 32 as pressurization) is exerted, and the base 23 is not tilted against the main frame 4. In the damper 30 of the above example embodiment, pressurization that can withstand the force generated by an assumed acceleration is set. With this configuration, a posture change of the main frame 4 can be reduced or prevented during acceleration of the overhead conveying vehicle 1. In other words, swaying in the conveyed object 90 can be reduced or prevented during acceleration of the overhead conveying vehicle 1.

In the overhead conveying vehicle 1 of the present example embodiment, since pressurization is applied to the dampers 30, 30 in both the front and the rear directions, although not illustrated as in FIG. 7B, a posture change of the main frame 4 is able to be reduced or prevented also during deceleration of the overhead conveying vehicle 1. In other words, in the present example embodiment, since pressurization is set to withstand the force generated by assumed deceleration, swaying of the conveyed object 90 can be reduced or prevented during deceleration of the overhead conveying vehicle 1.

Example embodiments have been described above, but the present invention is not limited to the example embodiments described above. Various modifications can be made without departing from the gist of the present invention.

In the overhead conveying vehicle 1 of the above example embodiments, the pair of supports 21, 21 rotatably support the turning shaft 26 via the resin bush 27, but if the resin bush 27 is replaced with a rubber bush formed from, for example, nitrile rubber, torsion of the rubber bush can effectively reduce or prevent vibrations from the conveyor 2, including not only vibrations in the rotation direction of the turning shaft 26 but also vibrations in other directions, from being propagated to the conveyed object 90.

In the above example embodiments, an example is described in which the base 23 is rotatable only in the front-and-rear direction (with an axis extending in the left-right direction as the turning shaft), but the base 23 may be rotatable only in the right-and-left direction (with an axis extending in the front-and-rear direction as the turning shaft).

In the above example embodiments and modifications, an example is described in which the conveyor 2 includes the front traveling body 2A and the rear traveling body 2B that are rotatable with each other, but the conveyor 2 may be defined by a single traveling body.

In the above example embodiments and modifications, an example is described in which the turning shaft 26 is supported by the pair of supports 21, 21 via the resin bush 27. And the resin bushes 27, 27, which are interposed in the respective insertion holes 21a of the pair of supports 21, 21 may be formed of materials of different hardness from each other. For example, in a case where the left and the right resin bushes 27, 27 are different from each other and thus a position of the center of gravity of the vibration isolation unit 20 and that of the main body 3 viewed from the Z-axis direction differ from each other, or in a case where the conveyed object 90 is transferred in the right-and-left direction (lateral direction), the relative positional relationship of the main body 3 with respect to the conveyor 2 (a posture of the main body 3 with respect to the conveyor 2) can be easily maintained.

While example embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead conveying vehicle comprising:
   a main body to hold a conveyed object suspended and supported by a conveyor;
   a base suspended by the conveyor;
   a support provided on the main body to rotatably support the base via a turning shaft extending in a horizontal direction; and
   a pair of dampers provided on the base to sandwich the turning shaft in a second direction perpendicular or substantially perpendicular to both of a first direction in which the turning shaft extends and a vertical direction and movable to contact with the main body.

2. The overhead conveying vehicle according to claim 1, wherein the turning shaft extends in a direction perpendicular or substantially perpendicular to both a traveling direction of the conveyor and the vertical direction, and is located in a central or approximately central region of the main body in the traveling direction of the conveyor, and the pair of dampers sandwich the turning shaft in the traveling direction of the conveyor.

3. The overhead conveying vehicle according to claim 2, wherein the base is suspended from the conveyor via a pair of suspensions extending downward in the vertical direction from the conveyor, and the base rotatably supports the suspensions around an axis of the turning shaft that extends in an extending direction of the suspensions.

4. The overhead conveying vehicle according to claim 3, wherein
   the conveyor includes a traveling driver to be accelerated or braked by a magnetic force generated between the conveyor and a magnetic plate on a traveling rail; and
   the pair of suspensions and the pair of dampers do not overlap with each other in plan view as viewed from the vertical direction.

5. The overhead conveying vehicle according to claim 4, wherein the damper includes a rubber and a spring.

6. The overhead conveying vehicle according to claim 5, wherein the support rotatably supports the turning shaft via a rubber bush.

7. The overhead conveying vehicle according to claim 4, wherein the support rotatably supports the turning shaft via a rubber bush.

8. The overhead conveying vehicle according to claim 3, wherein the damper includes a rubber and a spring.

9. The overhead conveying vehicle according to claim 8, wherein the support rotatably supports the turning shaft via a rubber bush.

10. The overhead conveying vehicle according to claim 3, wherein the support rotatably supports the turning shaft via a rubber bush.

11. The overhead conveying vehicle according to claim 2, wherein the damper includes a rubber and a spring.

12. The overhead conveying vehicle according to claim 11, wherein the support rotatably supports the turning shaft via a rubber bush.

13. The overhead conveying vehicle according to claim 2, wherein the support rotatably supports the turning shaft via a rubber bush.

14. The overhead conveying vehicle according to claim 1, wherein the damper includes a rubber and a spring.

15. The overhead conveying vehicle according to claim 14, wherein the support rotatably supports the turning shaft via a rubber bush.

16. The overhead conveying vehicle according to claim 1, wherein the support rotatably supports the turning shaft via a rubber bush.

\*　\*　\*　\*　\*